United States Patent [19]

Niroomand et al.

[11] Patent Number: 5,990,002
[45] Date of Patent: Nov. 23, 1999

[54] METHOD OF MAKING AN ANTIREFLECTIVE STRUCTURE

[75] Inventors: Ardavan Niroomand; Fernando Gonzalez, both of Boise, Id.

[73] Assignee: Micron Technology, Inc, Boise, Id.

[21] Appl. No.: 09/082,752

[22] Filed: May 21, 1998

Related U.S. Application Data

[62] Division of application No. 08/844,398, Apr. 18, 1997, Pat. No. 5,886,391.

[51] Int. Cl.$^6$ .......................... H01L 21/027; H01L 21/31
[52] U.S. Cl. .......................... 438/636; 438/424; 438/624; 438/952; 257/510; 257/640
[58] Field of Search ...................................... 438/636, 424, 438/435, 443, 624, 296, 359, 952; 257/510, 513, 640, 649

[56] References Cited

U.S. PATENT DOCUMENTS

| | | | |
|---|---|---|---|
| 4,541,167 | 9/1985 | Havermann et al. | 29/576 |
| 5,229,316 | 7/1993 | Lee et al. | 437/67 |
| 5,259,924 | 11/1993 | Mathews et al. | 156/653 |

*Primary Examiner*—John F. Niebling
*Assistant Examiner*—Ha Tran Nguyen
*Attorney, Agent, or Firm*—Workman, Nydegger & Seeley

[57] ABSTRACT

Inventive antireflective structures comprise a semiconductor substrate having hereon a combination of a plurality of layers that either that absorb reflected light or that dissipate reflected light into patterns and intensities that do not substantially alter photoresist material on the semiconductor substrate. The semiconductor substrate has formed thereon a feature having a width of less than about 0.25 microns. Antireflective structures contemplated include a first layer of polysilicon and first layer of silicon nitride material that is formed upon the first layer of polysilicon. The antireflective structure has the ability to scatter unabsorbed light into patterns and intensities that are substantially ineffective to alter photoresist material exposed to said patterns and intensities. A first antireflective structure comprises a first layer of polysilicon disposed upon on a semiconductor substrate, a second layer of silicon nitride material disposed upon the first layer of polysilicon, and a masking layer disposed upon the second layer of silicon nitride material. A second antireflective structure comprises a first layer of polysilicon disposed upon on a semiconductor substrate, a first layer of nitride material disposed upon the first layer of polysilicon, a second layer of polysilicon disposed upon the first layer of silicon nitride material, and a masking layer disposed upon the second layer of polysilicon. A third antireflective structure comprises a first layer of polysilicon disposed upon on a semiconductor substrate, a first layer of silicon nitride material disposed upon the first layer of polysilicon, a second layer of polysilicon disposed upon the first layer of silicon nitride material, a second layer of silicon nitride material disposed upon the second layer of polysilicon, and a masking layer disposed upon the second layer of silicon nitride material.

28 Claims, 6 Drawing Sheets

METHOD OF MAKING AN ANTIREFLECTIVE STRUCTURE

RELATED APPLICATIONS

This is a divisional patent application of U.S. patent application Ser. No. 08/844,398, filed on Apr. 18, 1997 now U.S. Pat. No. 5,886,391.

BACKGROUND OF THE INVENTION

1. The Field of the Invention

The present invention relates to the fabrication of integrated circuits. More particularly, the present invention relates to an anti-reflective enhancement for integrated circuit fabrication. In particular, the present invention relates to an anti-reflective enhancement for reducing critical dimension loss during mask patterning.

2. The Relevant Technology

In the microelectronics industry, a substrate refers to one or more semiconductor layers or structures which includes active or operable portions of semiconductor devices. In the context of this document, the term "semiconductive substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. The term substrate refers to any supporting structure including but not limited to the semiconductive substrates described above.

In the microelectronics industry, the process of miniaturization entails shrinking the size of individual semiconductor devices and crowding more semiconductor devices within a given unit area. With miniaturization, problems arise with proper electrical isolation between components. When miniaturization demands the shrinking of individual devices, isolation structures must also be shrunk. Attempts to isolate components from each other in the prior art are limited to photolithographic limits of about 0.25 microns. One way to form structures that electrically isolate conductive materials on a semiconductor substrate from each other is to use photolithography in patterning dielectrics layers upon the semiconductor substrate.

To form an isolation trench on a semiconductor substrate by photolithography, a photoresist mask through which the isolation trench is etched generally utilizes a beam of light, such as ultraviolet (UV) light and deep UV (DUV) light, to transfer a pattern through an imaging lens from a photolithographic template to a photoresist coating which has been applied to the structural layer being patterned. The pattern of the photolithographic template includes opaque and transparent regions with selected shapes that match corresponding openings and intact portions intended to be formed into the photoresist coating. The photolithographic template is conventionally designed by computer assisted drafting and is of a much larger size than the semiconductor wafer on which the photoresist coating is located. Light is directed through the photolithographic template and is focused on the photoresist coating in a manner that reduces the pattern of the photolithographic template to the size of the photolithographic coating and that develops the portions of the photoresist coating that are unmasked and are intended to remain. The undeveloped portions are thereafter easily removed. Other photolithographic techniques for formation of isolation trenches are also possible.

The resolution with which a pattern can be transferred to the photoresist coating from the photolithographic template is currently limited in commercial applications to widths of about 0.25 microns. In turn, the dimensions of the openings and intact regions of the photoresist mask, and consequently the dimensions of the shaped structures that are formed with the use of the photoresist mask, are correspondingly limited. Photolithographic resolution limits are thus a barrier to further miniaturization of integrated circuits. Accordingly, a need exists for an improved method of forming isolation trenches that have a size that is reduced from what can be formed with conventional photolithography.

During photolithography, reflected light that occurs during exposure of a mask tends to blur the desired image because the reflected light escapes beyond exposed regions on the photoresist. The blurring problem is caused by reflected light affecting areas of the photoresist that are outside the design pattern.

FIG. 1 illustrates the problem of blurring caused by reflected light that occurs during exposure of a photoresist. A semiconductor structure 10 may be, for example, an isolated active area 8X that was designed to have a width D, but due to blurring caused by reflectivity of patterning light from structures beneath the photoresist, isolated active area 8X has an actual width A. The variance between design width D and actual width A is illustrated as the distance 2(B/2) or B. By way of example, isolated active area 8X was designed to have a width D of 10 in arbitrary units, but due to blurring caused from reflectivity, the actual width A is nine in arbitrary units. It can be seen that a ten percent variance between design and actual width has occurred.

As miniaturization technology continues, a blurring variance of B as illustrated in FIG. 1 will increase relative to an ever-decreasing design width D. Thus, as also illustrated in FIG. 1, an isolated active area 8Z that may have a design width D' of, for example two and one-half in arbitrary units, variance B will have the effect of causing a 40 percent error. A variance B may leave insufficient space upon isolated active area 8Z to form desired contacts or structures. It can be seen from the demonstration illustrated in FIG. 1, that the need to eliminate or substantially reduce blurring must keep pace with miniaturization.

Prior art methods for avoiding reflected light and its photoresist blurring problems include using layers such as titanium nitride or organic materials that reduce the reflected light in order to better control resolution of the photoresist.

Another hindrance to photolithographic limitations are conventional antireflective coating (ARC) schemes. As the ever-increasing pressure to miniaturize bears upon the microelectronics industry, the conventional antireflective enhancements such as a titanium nitride layer, organic layers, or other layers known in the art are proving inadequate at resolutions below about 0.25 microns.

One problem at a dimension below about 0.25 microns is that of fouling caused by titanium nitride or organic materials. Fouling is defined as a tendency for a selected antireflective layer to resist staying within preferred boundaries. Resistance to staying within preferred boundaries tends to cause photolithographic techniques to be compromised.

When the ARC is a polymer film, it is applied directly to the semiconductor structure to a thickness of about 0.5 microns and photoresist is deposited on top of the ARC. The ARC then has the function of absorbing most of the radiation used during exposure of the resist that penetrates the resist material. Both standing wave effects and destructive scattering from typographical features are suppressed with use of the ARC. A disadvantage of a polymer film ARC is that the process is increased in complexity and dimensional control may be lost. A polymer film ARC requires application by spin coating of the ARC material and pre-baking of same before applying the photoresist material. A problem of removing the ARC exists following an etch. For example, during anisotropic etching, portions of a photoresist are mobilized and form a liner within a recess that is being etched that further assists in achieving the anisotropic etch. Due to the anisotropic etch, however, the photoresist that was mobilized may have mingled with other elements that cause it to resist removal by conventional stripping techniques. This resistance to stripping requires stripping solutions that have a chemical intensity that may detrimentally effect the structure that was achieved during the anisotropic etch. Thus, using a substance that is intended to aid antireflectivity the benefit thereof mitigated by the requirement of a more chemically intensive stripping solution treatment.

Another method of attempting to avoid reflected light is to use a metallic mask. Metallic materials, however, can cause contamination of the semiconductor structure due to the high mobility of metal ions in wet chemical environments or in dry-etch vapors. Additionally, although a metallic mask may remain as part of a finished semiconductor structure, a metallic mask may not be able to properly withstand high processing temperatures sometimes required to achieve a preferred semiconductor structure.

One application in the microelectronics industry is to isolate active areas by substantially surrounding them with dielectric structures. As dimensions shrink below about 0.25 microns, the prior art technique of growing a local oxidation of silicon (LOCOS) to isolate an active area becomes more difficult to achieve. This difficulty is due to the inability to control encroachment of the LOCOS structure into the active area during growth of the LOCOS. Several techniques have been developed to control the encroachment of what is called the "bird's beak" of the LOCOS into the active area, but these techniques require extra operations, each of which adds to fabrication time and cost as well as tending to lower overall fabrication yield.

Alternatively, isolated active areas have been fabricated by forming trenches on either side of a semiconductor region and by depositing dielectric materials into the trenches. The challenge for isolation trenches that isolate an active area with a width of less than about 0.25 microns is in overcoming the inherent problems of reflected light and antireflective coatings of the prior art as discussed above. Light that is reflected during exposure of a photoresist tends to blur the boundary between the active area and the trench such that the trench that is eventually etched encroaches into a designed active area and the designed active area is dimensionally compromised or rendered defective.

In general, several problems are caused by reflected light in photolithographic techniques which blur the edge of a critically dimensioned photoresist layer. In addition to problems experienced in forming isolation trenches, contact corridors, vias, and wiring trenches that must be patterned below about 0.25 microns are also blurred and are therefore widened beyond that which is preferred. A contact corridor that is too wide will cause notching into a gate stack during a contact corridor etch. Notching causes encroachment into conductive areas of a gate stack and filling the contact corridor with metallization causes a short to occur between the contact and the conductive elements of the gate stack. A trench that is too wide will cause "cross talk" between neighboring trenches so as so to compromise speed and accuracy of the integrated circuit associated therewith.

What is needed is an antireflective coating scheme that does not substantially add to fabrication cost and does not substantially reduce fabrication yield. What is also needed is an antireflective coating scheme that imparts an antireflective quality to photolithographic techniques not previously achieved in the prior art. What is also needed is an antireflective coating scheme that does not cause fouling of the semiconductor structure. Additionally, what is needed is an antireflective coating scheme that either does not require removal, or that can be removed without causing contamination or damage to the semiconductor structure. What is also needed is an antireflective coating scheme that facilitates a better photoresist profile and better control of critical dimensions due to better prevention of reflected light than is found in the prior art.

SUMMARY OF THE INVENTION

Preferred antireflective structures of the present invention each are situated upon a semiconductor substrate having thereon a plurality of layers that act in concert to either absorb reflected light or dissipate reflected light into patterns and intensities that are substantially inconsequential as to the alteration of photoresist material situated outside of a selected design area that is exposed to the patterns and intensities. The semiconductor substrate has one or more features formed thereon having a width of less than about 0.5 microns, and preferably less than 0.25 microns.

Antireflective structures according to the present invention comprises a first layer of polysilicon having a thickness of less than about 500 Å and a grain size in a range from about 500 Å to about 2,500 Å. The first layer of polysilicon resists fouling of a semiconductor substrate upon which the first layer of polysilicon is situated. The first layer of polysilicon has the ability to scatter unabsorbed light into patterns and intensities that are substantially ineffective to photoresist material exposed to the patterns and intensities.

A first layer of nitride material is formed substantially conformably upon the first layer of polysilicon. The first layer of nitride material has a thickness in a range from about 200 Å to about 1,000 Å, is substantially composed of a material that also resists fouling of the semiconductor substrate, and that absorbs a substantial portion of patterning light that penetrates the photoresist material. The first layer of nitride material may optionally be used in subsequent processing such as an etch stop. A preferred material for the first layer of nitride material is silicon nitride. Silicon nitride of the first layer of nitride material may be formed by chemical vapor deposition (CVD) or by thermal transformation of a portion of the first layer polysilicon into a polysilicon layer and a silicon nitride layer.

A first antireflective structure of the present invention comprises a first layer of polysilicon having a thickness of less than about 500 Å and a grain size in a range from about 500 Å to about 2,500 Å disposed upon on a semiconductor substrate, a second layer of nitride material having a thickness in a range from about 200 Å to about 1,000 Å disposed substantially conformably upon the first layer of polysilicon, and a masking layer disposed upon the second layer of nitride material.

As an example of optimization of antireflectivity, the first antireflective structure of the present invention is formed by using a first layer of polysilicon that is formed upon a pad oxide layer. Thermal transformation of the upper surface of the first layer of polysilicon is carried out under conditions that allow for a nitride layer to grow downwardly into the first layer of polysilicon. The structure achieved has the quality of a preferred light-dissipating topography imparted to the upper surface of the first layer of polysilicon and a light-absorbing first layer of nitride material that conforms to the first layer of polysilicon.

A second antireflective structure of the present invention comprises a first layer of polysilicon disposed upon on a semiconductor substrate, a first layer of nitride material disposed substantially conformably upon the first layer of polysilicon, a second layer of polysilicon that may or may not be substantially composed of the same material as that of the first layer of polysilicon, and a masking layer disposed upon the second layer of polysilicon.

The second antireflective structure of the present invention may be formed to achieve another preferred embodiment that comprises formation of a first layer of polysilicon, formation of a first layer of nitride material above the first layer of polysilicon, and formation of a second layer of polysilicon above the first layer of nitride material. Formation of the second layer of polysilicon above the first layer of nitride material accomplishes renewal of a preferred polysilicon topography that scatters light according to the preferred embodiment of the present invention, and light is additionally absorbed into the first layer of nitride material when the light penetrates the second layer of polysilicon. If light reflects from the first layer of nitride material, the light must pass through the second layer of polysilicon so as to once again be subject to scattering.

A third antireflective structure of the present invention comprises a first layer of polysilicon disposed upon on a semiconductor substrate, a first layer of nitride material disposed substantially conformably upon the first layer of polysilicon, a second layer of polysilicon disposed substantially conformably upon the first layer of nitride material, a second layer of silicon nitride material disposed upon the second layer of polysilicon, a second layer of nitride material disposed substantially conformably upon the second layer of polysilicon, and a masking layer disposed upon the second layer of nitride material.

The third antireflective structure of the present invention may comprise a combination of layers of polysilicon and layers of nitride material which may be used in sequence to act as light dissipators and light absorbers, respectively. For example, a first layer of polysilicon and a first layer of nitride material are formed upon a semiconductor substrate. Then, a second layer of polysilicon is deposited upon the first layer of nitride material, and a second layer of nitride material is likewise formed upon the second layer of polysilicon. As such, the fourth antireflective structure of the present invention may comprise a plurality of alternating layer of polysilicon and nitride material. Limitations to the number of layers depend upon a preferred antireflectivity and processing limitations as to layer thickness and layer of polysilicon grain size.

Through formation of the first, second, and third antireflective structures of the present invention, as well as variations thereof, various semiconductor devices can be fabricated. By way of an application example, a semiconductor device can be fabricated to include a first layer of polysilicon disposed upon on a semiconductor substrate, where the first layer of polysilicon is substantially entirely above an active area within the semiconductor substrate. The active area is isolated with filled isolation trenches. A second layer of polysilicon is disposed upon the first layer of polysilicon and upon the filled isolation trenches. An optional first layer of nitride material can be disposed upon the second layer of polysilicon. In the fabrication of this semiconductor device, masking of the structure was required in order to form the active area to desired dimensions. Through antireflective layers in the structure formed, light is substantially prevented from blurring so that sub-micron features can be properly dimensioned in a photolithography process.

Grain size control is used according to the present invention to achieve the effect of dissipating reflected light into light patterns or intensities that are substantially inconsequential in affecting regions of photoresist that are exposed to said intensities and patterns. Control of grain size to facilitate preferred grain size growth and formation may include preparing the semiconductor substrate surface by texturing it with an etch or an equivalent treatment.

Grain size formation can be accomplished by various methods. For example, annealing of polysilicon under a partial or virtually complete vacuum can cause grain size growth. An alternative processing method of forming grain size morphology according to the present invention includes flashing undisassociated chemical vapor deposition (CVD) materials that are entrapped in CVD polysilicon.

Besides preferred grain sizes, the layer of polysilicon may have specific doping schemes that are used to optimize the present invention. Doping may be carried out in situ during formation of a layer or it may be carried out subsequent to formation, for example by ion implantation. Doping, in the case of polysilicon, may be done in order to achieve a preferred conductivity of the polysilicon in order to use at least a portion of the layer of polysilicon for a conductive element in the finished integrated circuit.

The reflectivity exhibited by antireflective structures of the present invention can be described as the fraction of incident light energy that escapes from the surface of the antireflective structure when irradiated by photoresist patterning light under normal operating conditions. Various ways of describing reflectivity may be expressed. For example, a simple percentage may be given for a preferred reflectivity. A preferred reflectivity for the present invention is in a range from about 0.1 to about 10 percent, more preferably about 0.1 percent to about 2 percent, and most preferably about 0.1 percent to about 1 percent. It can be appreciated that various materials can be selected and tested that can be compared with preferred rough or HSG layer of polysilicon in combination with preferred nitride layers as disclosed above. It can be further appreciated that one of ordinary skill in the art will be able to select from fouling-resistant, light-dissipating, and light-absorbing combinations to form an antireflective structure with a reflectivity range of the present invention by reading the specification and by practicing the invention.

In connection with preferred materials and preferred reflectivities of selected structures, it is also useful to describe the present invention in terms of a variance between the design geometry and the actual characteristic geometry of the structure achieved. A mask may be designed with a first preferred characteristic geometry and, the actual geometry will vary from the design geometry. With geometries contemplated by the present invention, a variance of less than 10 percent is preferred and a variation of less than 5 percent is most preferred. It can be appreciated that, as integrated circuit device geometries continue to shrink, the variance preferably either remains relatively constant or must also shrink.

The method of the present invention may be used to form various structures with preferred geometries such as isolation trenches, active areas, contact corridors, vias, stacked storage node wells, and wiring trenches as non-limiting examples.

These and other features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages of the invention are obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Preferred antireflective structures of the present invention comprise a semiconductor substrate having thereon a combination of a plurality of layers that act in concert to either absorb reflected light or to dissipate reflected light into patterns and intensities that do not substantial alter photoresist material that is exposed to the patterns and intensities. The semiconductor substrate will preferably have thereon a feature size with width dimension less than about 0.5 microns, and more preferably less than about 0.25 microns.

Figure 2:
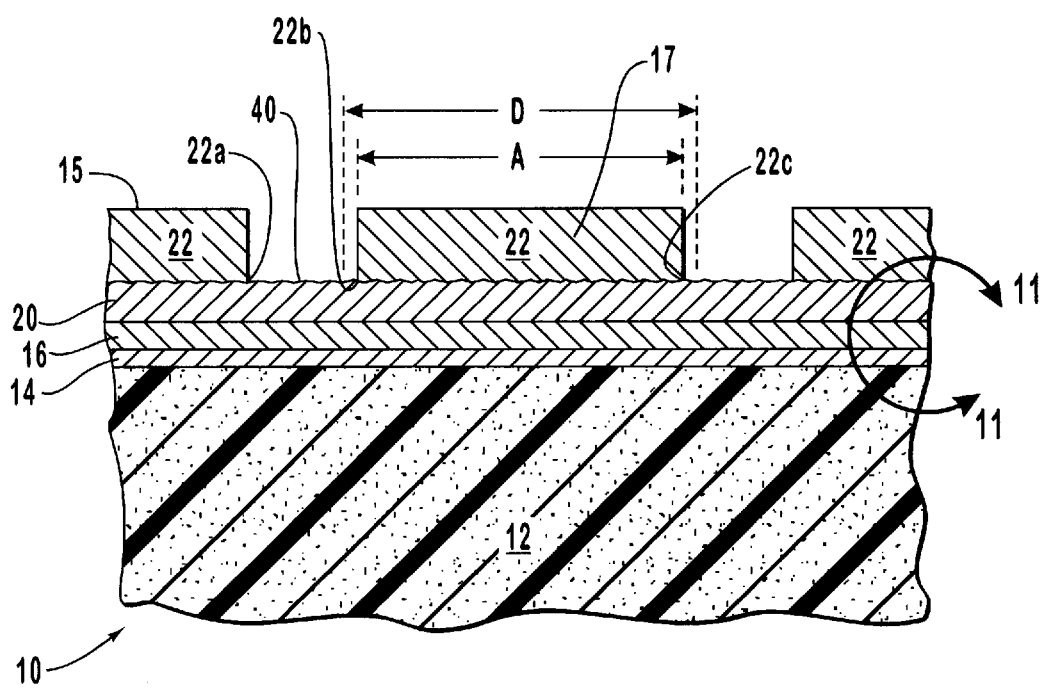
FIG. 2 is an elevation cross-section view of a semiconductor structure wherein a pad oxide layer is disposed upon a semiconductor substrate, a layer of polysilicon disposed upon the pad oxide layer, a layer of nitride material is disposed upon the pad oxide layer, and a mask that has been exposed and patterned with the aid of the layer of polysilicon, where the layer of nitride material has an antireflective quality.

By way of example and illustration of the inventive method and structure created thereby, FIG. 2 illustrates a first layer and upon a second layer, where the first layer is generally seen at 16 and the second layer is generally seen at 20. A first and second masking structure are generally seen, respectively, at 15 and 17. (Numbers) The structure to be created has a feature surface thereon that has a width of less than about 0.25 microns. To form such a feature surface, first layer 16 is formed on a semiconductor substrate 12, where first layer 16 includes at least one polysilicon layer, where the at least one polysilicon layer has a thickness of less than about 500 Å, and where the polysilicon material in the at least one polysilicon layer has a grain size in a range from about 500 Å to about 2,500 Å.

Second layer 20 is formed substantially conformably upon first layer 16, where second layer 20 has a thickness in a range from about 200 Å to about 1,000 Å. A feature surface is seen on second layer 20, having been created by a photolithographic patterning process. The feature surface has a first edge opposite a second edge, the first and second edges having a width therebetween of less than about 0.25 microns.

The feature surface seen in FIG. 2 is defined by at least one of two arrangements. In a first arrangement, the feature surface is defined by an interface with a mask structure 17 upon second layer 20, where mask structure 17 projects from second layer 20 and extends continuously between and terminates at first and second edges 22b, 22c of the feature surface. It is intended that the width between first and second edges 22b, 22c of the feature surface be less than about 0.25 microns. In a second arrangement, the feature surface is defined first and second masking structures 15, 17 upon second layer 20, wherein the interface of second layer 20 with first masking structure 15 terminates at first edge 22a of the feature surface, and wherein the interface of second layer 20 with second masking structure 17 terminates at second edge 22b of the feature surface. It is intended that the width between first and second edges 22b, 22c of the feature surface which is less than about 0.25 microns, as is seen from first and second masking structures 15, 17 being separated by the width between first and second edges 22b, 22c of the feature surface.

Materials

An antireflective structure according to the present invention comprises a first layer that resists fouling of the semiconductor structure and that has the ability to scatter unabsorbed light into patterns and intensities that do not substantially effect photoresist material that is exposed by the patterns and intensities. A preferred material for the first layer is at least one rough or hemispherical grained layer of polysilicon or an equivalent disposed upon the semiconductor substrate.

The at least one rough or hemispherical grained layer of polysilicon has a preferred thickness of less than about 500 Å. A rough grain size is defined herein as being in a range from about 500 Å to about 2,500 Å, preferably from about 500 Å to about 1,500 Å, and most preferably from about 500 Å to about 1,000 Å. A hemispherical grain (HSG) size is defined herein as being about 1,500 Å and larger. HSG polysilicon is a preferred material where the grain size is intended to be in the range from about 1,500 Å to about 2,500 Å. A smooth polysilicon grain size is defined herein as being less than about 500 Å. A smooth polysilicon grain size is less preferred in the present invention as it does not provide sufficient ability to substantially scatter errant light energy for feature geometries below about 0.5 microns.

Grain size is used according to the present invention to achieve the effect of scattering reflected light into light patterns or intensities that do not substantially affect photoresist that are exposed to such light patterns or intensities. Control of grain size may include texturing a surface with an etch or an equivalent treatment to facilitate preferred grain size growth. For example, a pad oxide layer 14, as illustrated in FIG. 2, may be grown to a selected thickness substantially uniformly across the entire surface of a semiconductor substrate 12 and then etched with an etch recipe that causes pad oxide layer 14 to form an irregular exposed surface. Deposition of a first polysilicon layer 16 then follows under conditions that cause grain growth due in part to the deposition upon the irregular surface of pad oxide layer 14. As such, grain size can be controlled to be within a selected grain size.

Grain size formation can be accomplished by various other methods. For example, annealing of polysilicon under a partial or substantially complete vacuum can cause grain growth. For example, grain size can be further controlled through pressures and temperature variations. After formation of a polysilicon layer, a vacuum may be drawn to develop a pressure within a processing chamber in a pressure range from about 1 $\mu$Torr to about one Torr. Annealing temperatures can be selected in a range from about 300 to about 700° C. for a time range from about 1 to about 120 minutes.

An alternative processing method of forming grain size morphology according to the present invention includes flashing undisassociated chemical vapor deposition materials that are entrapped in polysilicon. For example, where polysilicon is formed by deposition using a silane material precursor such as trisilane, dichlorosilane, or silane, the CVD is carried out under pressures and temperatures that promote incomplete dissociation of silicon from hydrogen during CVD such that some silane becomes entrapped within the matrix of the deposited polysilicon. Discrete charges of the silane precursor that vary slightly from each other in their dew points may be sequentially charged to the CVD vessel. As a first silane charge deposits without completely dissociating into polysilicon and gaseous hydrogen, a subsequent charge of silane that substantially dissociates upon contact with the semiconductor substrate at conditions within the CVD vessel will cause the undisassociated silane to agglomerate due to surface tension and incomplete surface wetting by the first silane charge. Thus, localized regions or silane pools from the second silane charge will form and subsequently be encapsulated by the polysilicon that is being deposited. By maintaining a pressure greater than ambient within the CVD vessel, and by suddenly venting the CVD vessel at temperature conditions to cause the encapsulated silane pools to flash, the flashing silane will tend to fracture the polysilicon.

For specific applications, selection of light intensities used to expose photoresist materials are within the capability of one of ordinary skill in the art. For example, deep ultraviolet (DUV) light may have a preferred use depending upon the photoresist material and the specific geometry of a feature to be formed. In other applications, a G-line, I-line, K-line or other preferred intensities may be selected in connection with preferred photoresist materials and preferred geometries of a feature to be formed.

Besides preferred grain sizes, first polysilicon layer 16 may be formed with specific doping schemes that are used to optimize the present invention. Doping of first polysilicon layer 16 may be carried out in situ during formation of the first or subsequent layers, or it may be carried out subsequent to formation, for example by ion implantation. Doping, in the case of polysilicon, may be done in order to achieve a preferred conductivity of the polysilicon in order to use at least a portion of the polysilicon layer for a conductive element in the finished integrated circuit. For example, polysilicon layer 16 may later form a word line in a gate stack where the polysilicon rests upon at least a portion of a pad oxide layer that would then be used as a gate oxide.

A second layer is formed substantially conformably upon first polysilicon layer 16. The second layer in the present invention comprises a material that also resists fouling of the semiconductor structure, that absorbs a substantial portion of patterning light that has penetrated the photoresist material, and optionally that may be used in subsequent processing such as an etch stop. A preferred class of materials for the second layer comprises nitride materials or equivalents. Silicon nitride is often expressed in literature as $Si_3N_4$, however, it is understood that the term silicon nitride includes non-stoichiometric silicon-to-nitrogen ratios that may be incidental to the process or that may be selected in a ratio that has a particular advantage to the specific application. For example, silicon-rich silicon nitride has been found to enhance antireflectivity. Silicon-rich silicon nitride is understood to be a silicon nitride wherein the silicon is present in a stoichiometric quantity more than three silicons to four nitrogens. Silicon-rich silicon nitride in this context means the presence of silicon in $Si_xN$ wherein x is in a range from greater than about 0.75 to about 10. Silicon nitride may be formed by chemical vapor deposition (CVD) or by thermal transformation of a portion of first polysilicon layer 16 into a nitride layer 20.

The quality of light scattering that is achieved by the topography of polysilicon layer 16 can be diminished by formation of nitride layer 20 because distinct grain boundaries, viewed in cross section, will be softened by filling nitride layer 20 substantially conformably upon polysilicon layer 16. In a preferred embodiment, nitride layer 20 is formed by thermal transformation of a portion of polysilicon layer 16. Thermal transformation is accomplished in a heated nitrogen environment where the upper surface 40 is created from polysilicon layer 16 through a transformation thereof into silicon nitride layer 20. Processing conditions are selected to optimize a balance between a sufficiently light-absorptive silicon nitride layer and a sufficiently irregular topography to dissipate any light energy that is reflected.

A first antireflective structure of the present invention comprises a first layer of polysilicon disposed upon on a semiconductor substrate, a first layer of nitride material disposed substantially conformably upon the first layer of polysilicon, and a masking layer disposed upon the first layer of nitride material.

As an example of optimization, the first antireflective structure of the present invention, as seen in FIG. 2, is formed by using a first polysilicon layer 16 comprising HSG polysilicon as defined above. Polysilicon layer 16 is formed upon pad oxide layer 14 with a grain size in a range from about 2,000 Å to about 2,500 Å. Polysilicon layer 16 is formed in a thickness range from about 500 Å to about 1,500 Å. Thermal transformation to create upper surface 40 of nitride layer 20 is carried out under conditions that allow for nitride layer 20 to grow from a portion of polysilicon layer 16 in the thickness range from about 200 Å to about 1,000 Å. Because nitride layer 20 was not subsequently deposited, no filling in of distinct grain boundaries occurred as would be the case of a CVD technique. The achieved structure has the quality of a preferred light-dissipating topography imparted to upper surface 40 of nitride layer 20 by the originally deposited polysilicon layer 16 and light-absorbing nitride layer 20 that conforms to the original topography.

The first antireflective structure of the present invention may alternatively be made by using rough polysilicon as defined above to form first polysilicon layer 16. The rough polysilicon is formed upon semiconductor substrate 12 with a grain size in a range from about 500 Å to about 1,500 Å. Polysilicon layer 16 is formed in a thickness range from about 500 Å to about 1,500 Å. Thermal transformation of upper surface 40 of nitride layer 20 is carried out under conditions that allow for nitride layer 20 to grow out of a portion of polysilicon layer 16 in the thickness range from about 200 Å to about 1,000 Å. Because nitride layer 20 was not subsequently deposited, no filling in of distinct grain boundaries occurred as would be in the case of a CVD technique. The achieved structure has the quality of a preferred light-dissipating topography imparted to upper surface 40 of nitride layer 20 by the originally deposited polysilicon layer 16 light-absorbing nitride layer 20 that conforms to the original topography.

All subsequently disclosed embodiments presuppose the use of either rough or HSG-grained polysilicon.

A second antireflective structure of the present invention comprises a first layer of polysilicon disposed upon on a semiconductor substrate, a first layer of nitride material disposed substantially conformably upon the first layer of polysilicon, a second polysilicon layer that may or may not be substantially the same material as the first layer of polysilicon, and a masking layer disposed upon the second layer of polysilicon.

Figure 3:
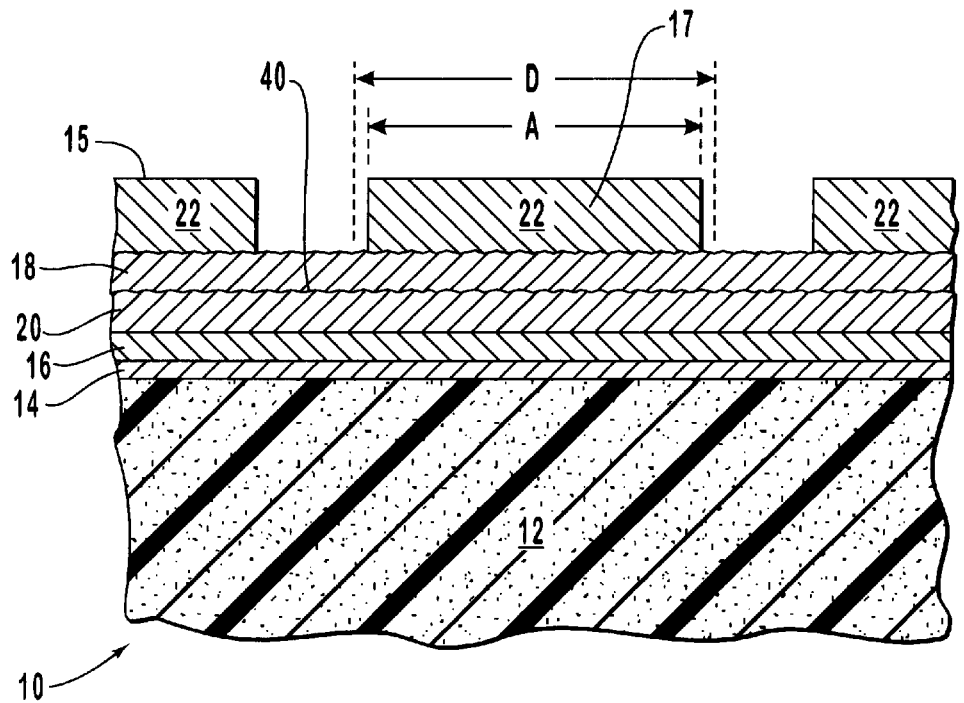
FIG. 3 is an elevational cross-section view of a semiconductor structure wherein pad oxide layer is disposed upon a semiconductor substrate, a first layer of polysilicon is disposed upon on the pad oxide layer, a first layer of nitride material is disposed substantially conformably upon the first layer of polysilicon, a second layer of polysilicon that may or may not be substantially the same material as the first layer of polysilicon is disposed upon the first layer of nitride material, and a masking layer is disposed upon the second layer of polysilicon.

The second antireflective structure of the present invention may be formed to achieve another preferred embodiment that comprises, as seen by example in FIG. 3, formation of first polysilicon layer 16, formation of nitride layer 20, and formation of a second polysilicon layer 18 above nitride layer 20. In this second embodiment, formation of nitride layer 20 may be done by any preferred method. Formation of second polysilicon layer 18 above nitride layer 20 accomplishes renewal of a rough or HSG polysilicon topography as defined herein that scatters light according to the preferred embodiment of the present invention, and light is additionally absorbed into nitride layer 20 when it penetrates second polysilicon layer 18. If light reflects from nitride layer 20, light must pass through second polysilicon layer 18 during which light is once again subject to scattering.

A third antireflective structure of the present invention comprises a first layer of polysilicon disposed upon on a semiconductor substrate, a first nitride layer disposed substantially conformably upon the first layer of polysilicon, a second polysilicon layer disposed substantially conformably upon the first nitride layer, a second nitride layer disposed substantially conformably upon the second polysilicon layer, and a masking layer disposed upon the second nitride layer.

Figure 4:
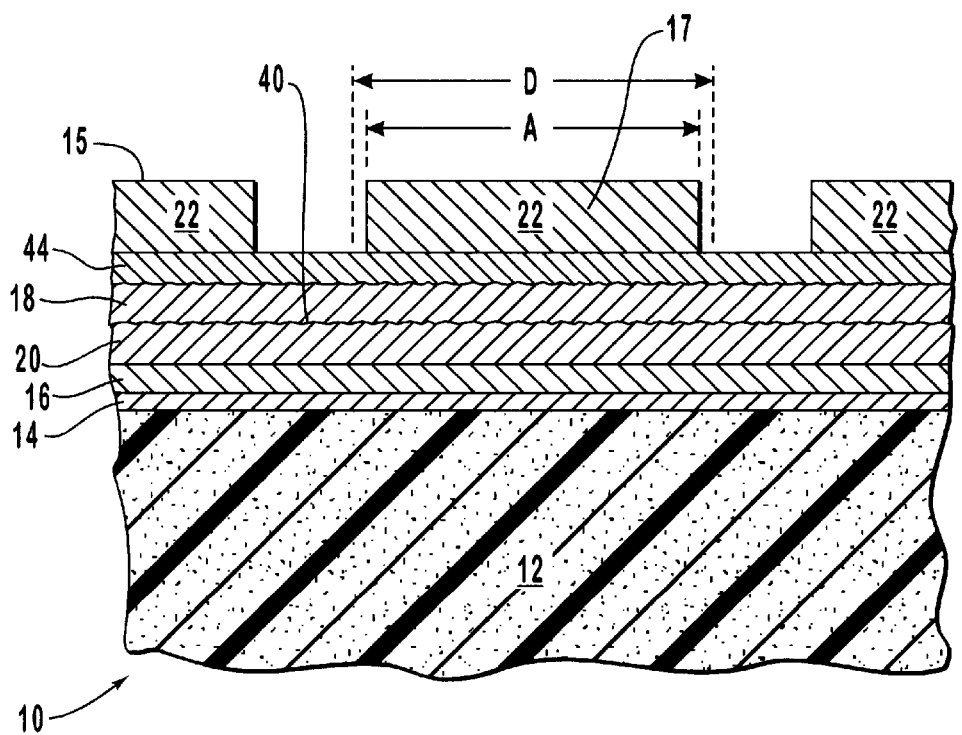
FIG. 4 is an elevational cross-section view of a semiconductor structure wherein a pad oxide layer is disposed upon a semiconductor substrate, a first layer of polysilicon is disposed upon on the pad oxide layer, a first layer of nitride material is disposed substantially conformably upon the first layer of polysilicon, a second layer of polysilicon that may or may not be substantially the same material as the first layer of polysilicon is disposed upon the first layer of nitride material, a second layer of nitride material is disposed substantially conformably upon the second layer of polysilicon, and a masking layer disposed upon the second layer of nitride material.

The third antireflective structure of the present invention may comprise a combination of polysilicon layers and nitride layers may be used in sequence to act as light dissipators and light absorbers, respectively. For example, as seen in FIG. 4, first polysilicon layer 16 to be formed upon pad oxide layer 14 has a thickness in a range from about 250 Å to about 500 Å. First nitride layer 20 is formed upon first polysilicon layer 16 by thermal transformation into upper surface 40 of first nitride layer 20 from a portion of first polysilicon layer 16 to form a silicon nitride depth in the thickness range from about 0 Å to about 250 Å represented in FIG. 4 as first nitride layer 20. Second polysilicon layer 18 is deposited upon first nitride layer 20 in a thickness range from about 250 Å to about 500 Å, and a second nitride layer 44 is likewise formed by thermal transformation of second polysilicon layer 18 to a silicon nitride depth in a thickness range from about 100 Å to about 250 Å.

The third antireflective structure of the present invention may comprise a plurality of polysilicon and nitride layers. Limitations to the number of layers depend upon a preferred antireflectivity and processing limitations as to layer thickness and polysilicon layer grain size.

As an example of a structure that is formed according to the present invention, a first layer of polysilicon is disposed upon on a semiconductor substrate that is substantially entirely above an active area that is isolated with filled isolation trenches. A second polysilicon layer disposed substantially conformably upon the first polysilicon layer and upon the filled isolation trenches. The structure represents further processing according to the present invention after dimensioning of an active area according to the present invention and after removal of the mask and nitride layer.

Reflectivty

The reflectivity exhibited by antireflective structures of the present invention can be described as the fraction of incident light energy that escapes from the surface of the antireflective structure when irradiated by photoresist patterning light under normal operating conditions. Various ways of describing reflectivity may be expressed. For example, a simple percentage may be given for a preferred reflectivity. A preferred reflectivity for the present invention is in a range from about 0.1 to about 10 percent, more preferably from about 0.1 to about 2 percent, and most preferably from about 0.1 to about 1 percent.

Materials may be selected by using such relationships as, for example, the Beer-Lambert law:

$$I=I_0\exp-(\epsilon\rho d) \qquad (1),$$

where I is the reflected light intensity, $I_0$ is the initial light intensity, $\epsilon$ is the black-body degree of opacity or light extinction coefficient of the material, $\rho$ is the density of the material, and d is the measured distance from the surface of the antireflective structure to a detector. It can be appreciated that various materials can be selected and tested that can be compared with the preferred rough or HSG polysilicon layers of the invention in combination with preferred nitride layers as disclosed above. It can be further appreciated that one of ordinary skill in the art will be able to select from fouling-resistant, light-dissipating, and light-absorbing combinations, and that a relationship between $\rho$ and $\epsilon$ can be used to choose equivalent materials to those that are disclosed herein.

Blurring Effects

Figure 1:
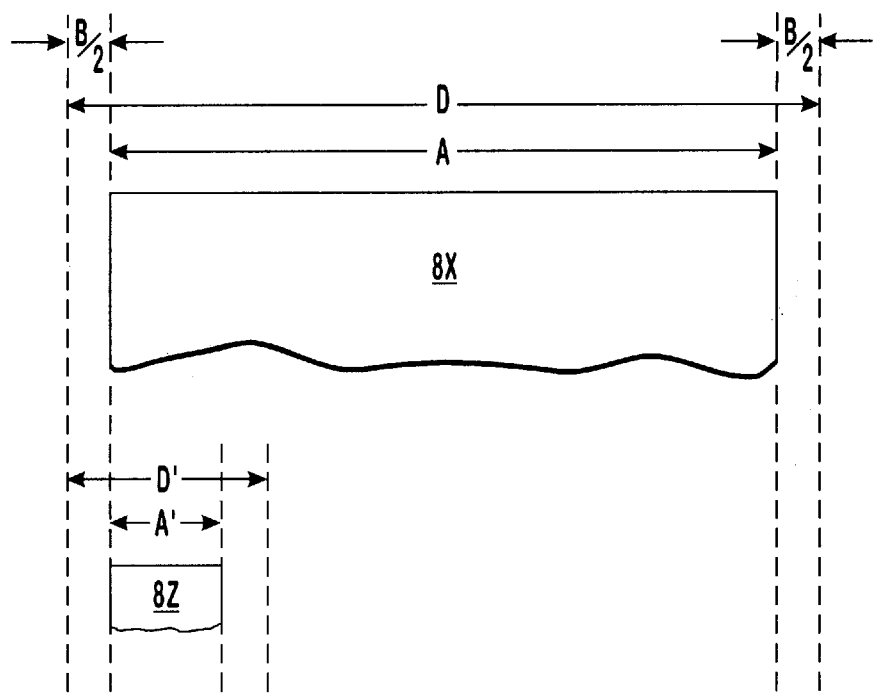
FIG. 1 is a planar view illustrating the blurring effect of light to distort sub-micron critical dimensions in conventional photolithography.

In connection with preferred materials and preferred reflectivities of selected structures, it is also useful to describe the present invention in terms of a variance from the design geometry of an actual characteristic geometry of the structure being fabricated. A mask may be designed with a first preferred characteristic geometry and, as illustrated in FIG. 1, the actual geometry exposed in photolithography will vary from the design geometry. With geometries contemplated by the present invention, a variance of less than 10 percent is preferred and a variation of less than 5 percent is most preferred. It can be appreciated that, as integrated circuit device geometries continue to shrink, the variance preferably either remains relatively constant or must also shrink.

Applications

The method of the present invention may be used to form various structures with preferred geometries such as isolation trench active areas. It is to be understood that the discussion of isolation trenches is merely illustrative and not limiting of the inventive method. For example, contact corridors, vias, stacked storage node wells, and wiring trenches are further non-limiting examples of structures that may also be formed by the inventive method and by use of the inventive antireflective structure.

Referring to FIG. 2, a semiconductor structure 10 is illustrated in elevational cross-section wherein a semiconductor substrate 12 is covered with a pad oxide layer 14, a first polysilicon layer 16, a nitride layer 20, and a mask 22 that has been patterned. It can be seen that a design width D of mask 22 and an actual width A are illustrated as having a width variance therebetween. By way of non-limiting example, semiconductor structure 10 represents a detail section that is to form an active area set off by isolation trenches.

For the non-limiting application of forming an isolation trench-isolated active area, the design width D of mask 22 according to the present invention is a width in a range from about 0.05 microns to about 0.5 microns, preferably from about 0.1 microns to about 0.25 microns, and most preferably from about 0.15 microns to about 0.2 microns.

Figure 5:
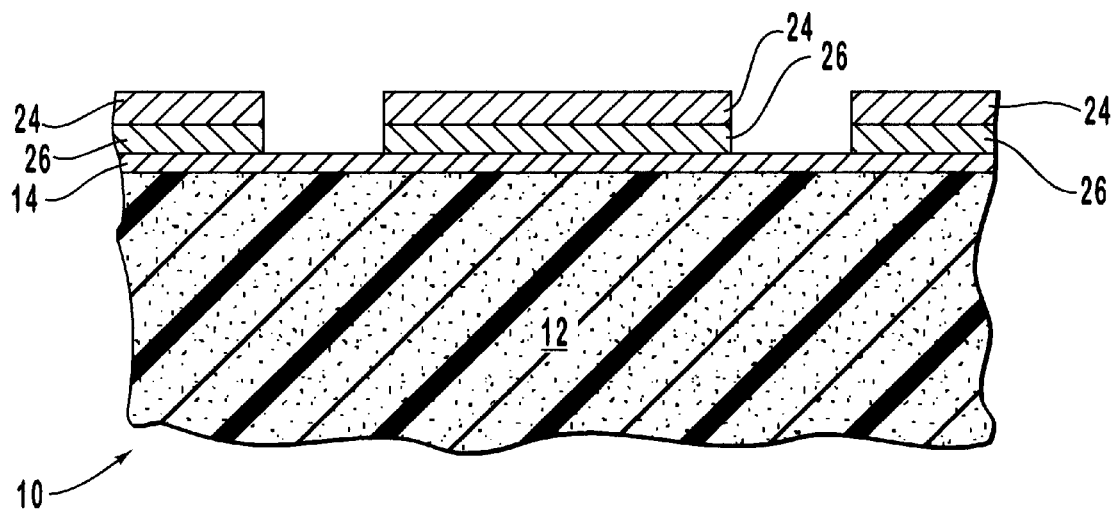
FIG. 5 is an elevational cross-section view of the semiconductor structure depicted in FIG. 2 after further processing, wherein with in situ or separately etched structures, a nitride island and a polysilicon island have been formed.

FIG. 5 illustrates semiconductor structure 10 depicted in FIG. 2 after further processing, wherein nitride layer 20 and first polysilicon layer 16 have been etched to form a nitride island 24 and a polysilicon island 26, respectively. Etching of nitride layer 20 and first polysilicon layer 16 may be carried out in situ or in a two-step process that comprises a first polysilicon-selective etch, and a second nitride-selective etch.

Figure 6:
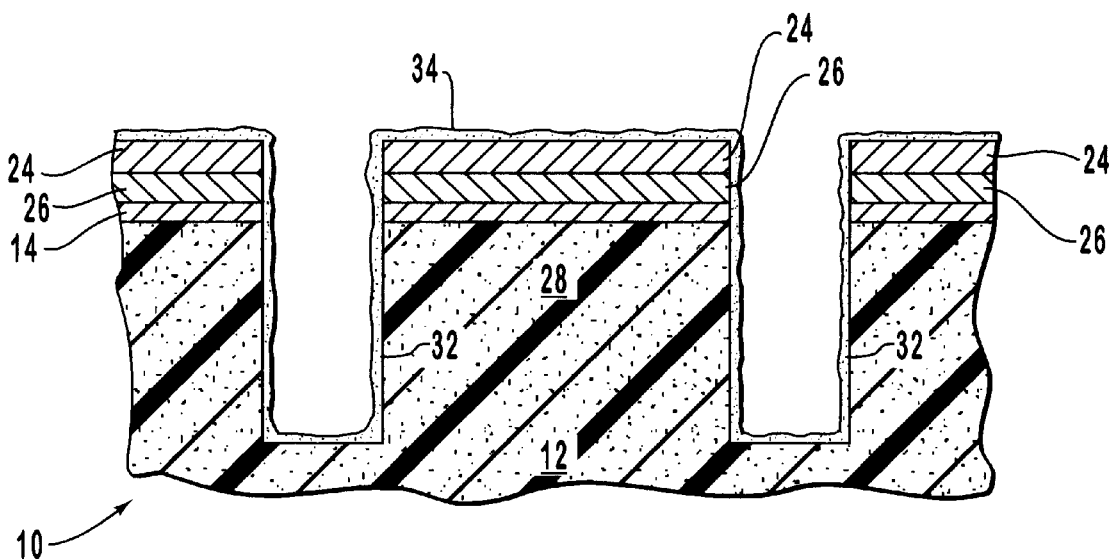
FIG. 6 illustrates the semiconductor structure depicted in FIG. 5 after further processing, wherein exposed portions of the semiconductor substrate, the first layer of polysilicon, and optionally the first layer of nitride material have been oxidized, following a trench etch to form an isolation region active area.
Figure 7:
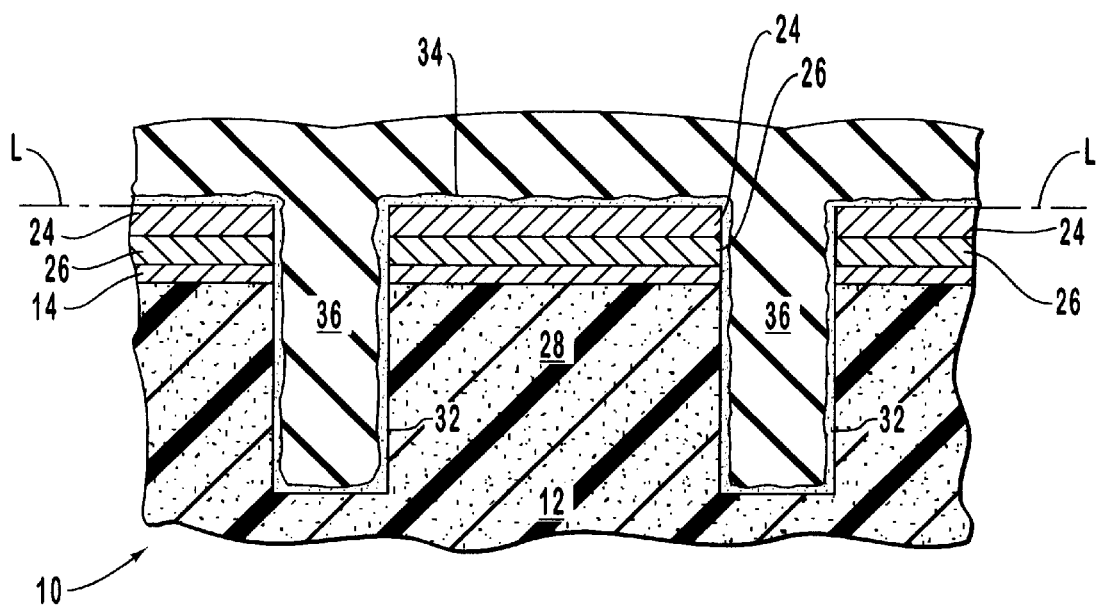
FIG. 7 illustrates the semiconductor structure depicted in FIG. 6 after further processing, wherein an isolation dielectric has been deposited over the semiconductor structure that substantially fills the isolation trenches, and where there exists a surplus of isolation dielectric over the semiconductor structure that is to be removed, for example, by chemical mechanical planarization.

FIG. 6 illustrates a preferred application of the present invention, wherein semiconductor structure 10 as depicted in FIG. 5 has been processed to form isolation trenches 30. It can be seen that a thermal oxide layer 32 and an optional thermal oxynitride layer 34 has formed upon exposed portions of silicon and nitride, respectively. Following thermal oxidizing to create thermal oxide layer 32 and optional thermal oxynitride layer 34, an isolation dielectric material 36 is been deposited over semiconductor structure 10 and substantially filled into the isolation trenches 30 as illustrated in FIG. 7. The isolation dielectric material can be silicon dioxide which is formed in a CVD process using a tetraethylorthosilicate (TEOS) precursor. Removal of isolation dielectric material 36 that is superficial to isolation trenches 30 may be carried out by a planarizing process such as chemical-mechanical planarization (CMP) or by an equivalent technique. CMP is carried out to remove all material essentially at or above the level indicated by dashed line L—L in FIG. 7. Thermal oxide layer 32 and an optional thermal oxynitride layer 34 provide advantages during profile reduction such as CMP where they may act as etch buffers. For example, an etch of isolation dielectric material 36 can be selective to thermal oxynitride layer 34 so as to remove superficial portions of isolation dielectric material 36 as the etch approaches nitride island 24.

Figure 8:
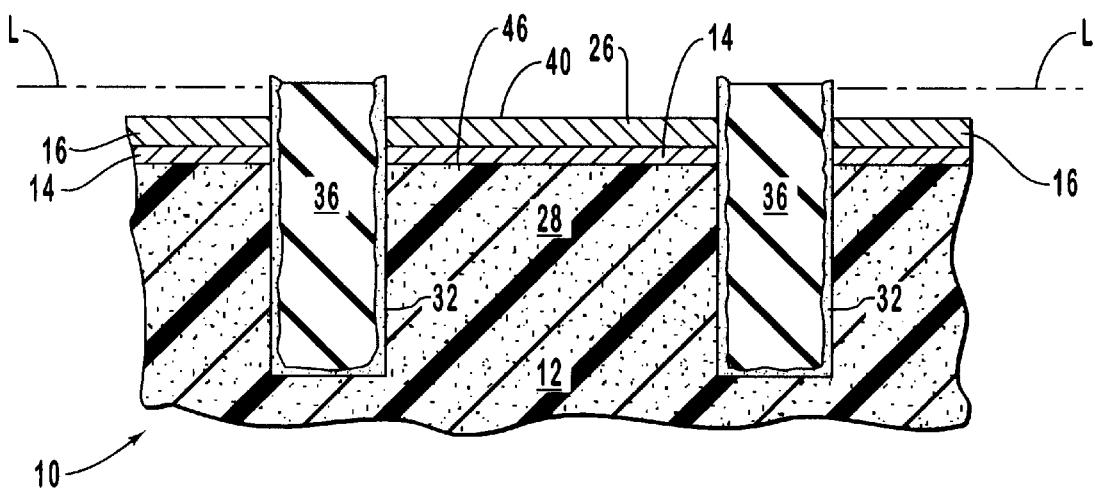
FIG. 8 illustrates a processing alternative for the semiconductor structure depicted in FIG. 7, wherein a portion of the isolation dielectric has been removed by a technique that uses mechanical planarization or as being performed through mechanical action such as chemical mechanical planarization (CMP), and wherein the first layer of nitride material has also been removed by a technique such as a polysilicon selective etch.
Figure 9:
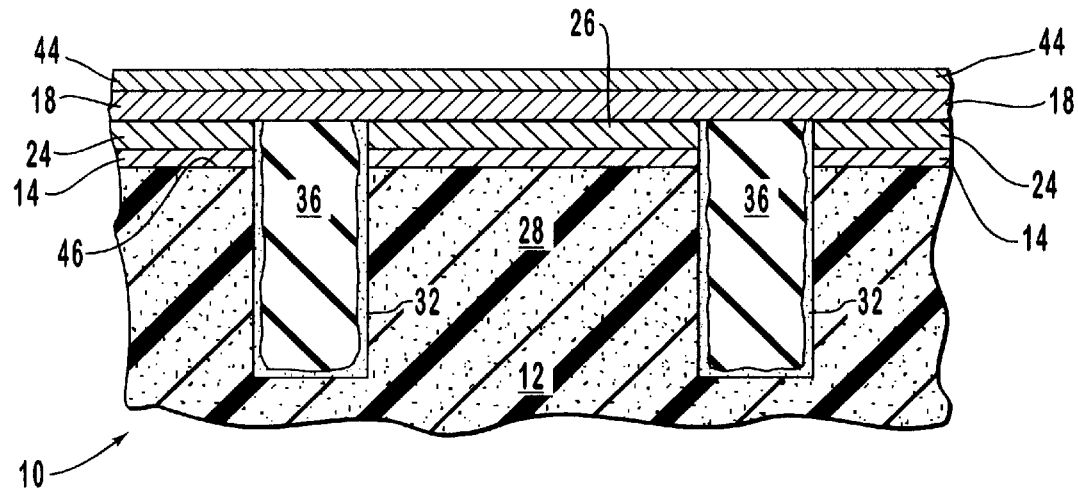
FIG. 9 illustrates a processing alternative for the structure depicted in FIG. 8, wherein a second layer of polysilicon has been formed substantially over the semiconductor structure, wherein a second layer of nitride material has been formed substantially over the second layer of polysilicon, thus forming an antireflective structure similar to that depicted in FIG. 2 with an added advantage that a critically-dimensioned structure is situated therebeneath.

Further processing of semiconductor structure 10 as illustrated in FIG. 8 comprises CMP to stop preferably on polysilicon island 26, and nitride island 24 is removed, for example, by use of a phosphoric acid etch. It can be seen that isolation dielectric material 36 fills isolation trench 30 so as to extend above upper surface 40 of polysilicon island 26. A second CMP may be done to lower the extension of isolation dielectric material 36 to a level substantially the same as upper surface 40 of polysilicon island 26 as seen in FIG. 9.

In an embodiment of the invention in which an isolation trench and active area is formed, various alternative processing paths may be chosen following CMP. In a first alternative processing path, a second polysilicon layer 18 is deposited over semiconductor structure 10, as illustrated in FIG. 9, and a second nitride layer 44 is formed upon second polysilicon layer 18. With the structure of second nitride layer 44 and second polysilicon layer 18, essentially the same antireflective structure as that depicted in FIG. 2 has been reproduced with the additional advantage that a critical dimension geometry comprising isolated active area 28 lies therebeneath. With second nitride layer 44 and second polysilicon layer 18 in place, a second mask may be patterned within the tolerances taught by the present invention. In this way, it can be appreciated that multiple antireflective structures may be formed in the course of fabrication of a preferred microelectronic device, during which fabrication photolithographic tolerances are improved over those of the prior art.

Figure 10:
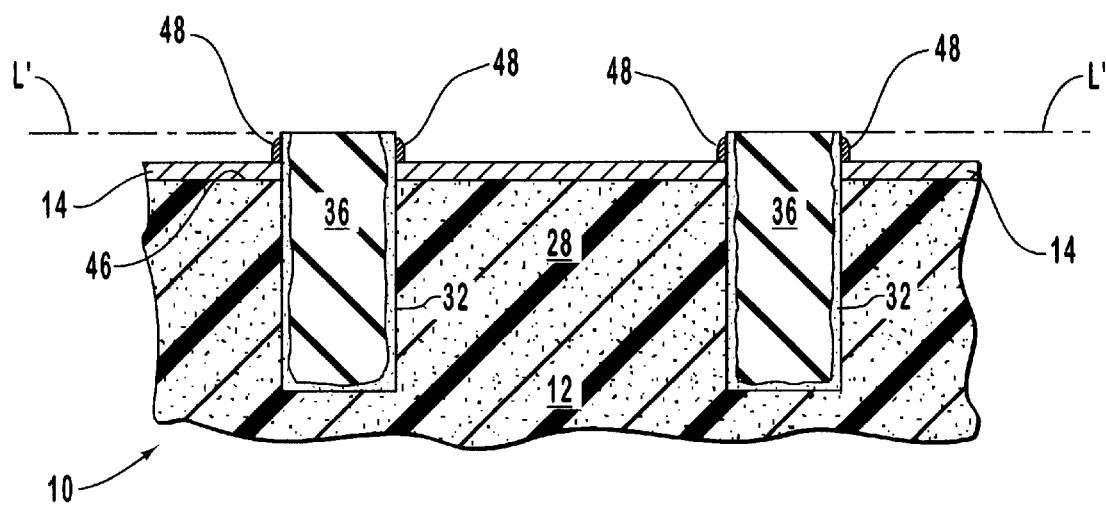
FIG. 10 illustrates a processing alternative for the structure depicted in FIG. 7, wherein a portion of the isolation dielectric has been removed by a technique such as CMP, wherein the first layer of nitride material has been removed by a technique such as a polysilicon selective etch, wherein the first layer of polysilicon has been removed by a technique such as an oxide selective etch, and wherein portions of the first layer of polysilicon may remain as spacers on the dielectric material that extends above an upper surface of the pad oxide layer.

In a second alternative processing path, a second etch is carried out to remove polysilicon island 26 and thereby to expose pad oxide layer 14 as illustrated in FIG. 10. The prominence of filled isolation trench 36 may be reduced during both a nitride etch and a polysilicon etch to a lever lower than that depicted in FIG. 10. Further, portions of polysilicon island 26 may remain as a polysilicon spacer 48 upon pad oxide layer 14 and upon thermal oxide layer 32 against isolation trench 30 filled with isolation dielectric material 36.

Pad oxide layer 14 may also be removed if there is a need to remove contaminants that may have encroached into it. A new oxide layer may be grown upon the exposed active area upper surface 46 after removing first polysilicon layer 16 and pad oxide layer 14. Where pad oxide layer 14 is not in danger of contamination, preferred structures can be formed upon pad oxide layer 14. For example, if a gate stack is being built above isolated active area 28, portions of pad oxide layer 14 that cover isolated active area 28 form a gate oxide layer. Further processing may include formation of second nitride layer 44 and second polysilicon layer 18, similarly to that depicted in FIG. 9 with the additional advantage that a critical dimension geometry comprising isolated active area 28 lies therebeneath. With second nitride layer 44 and second polysilicon layer 18 in place, a second mask may be patterned within the tolerances taught by the present invention.

Figure 11:
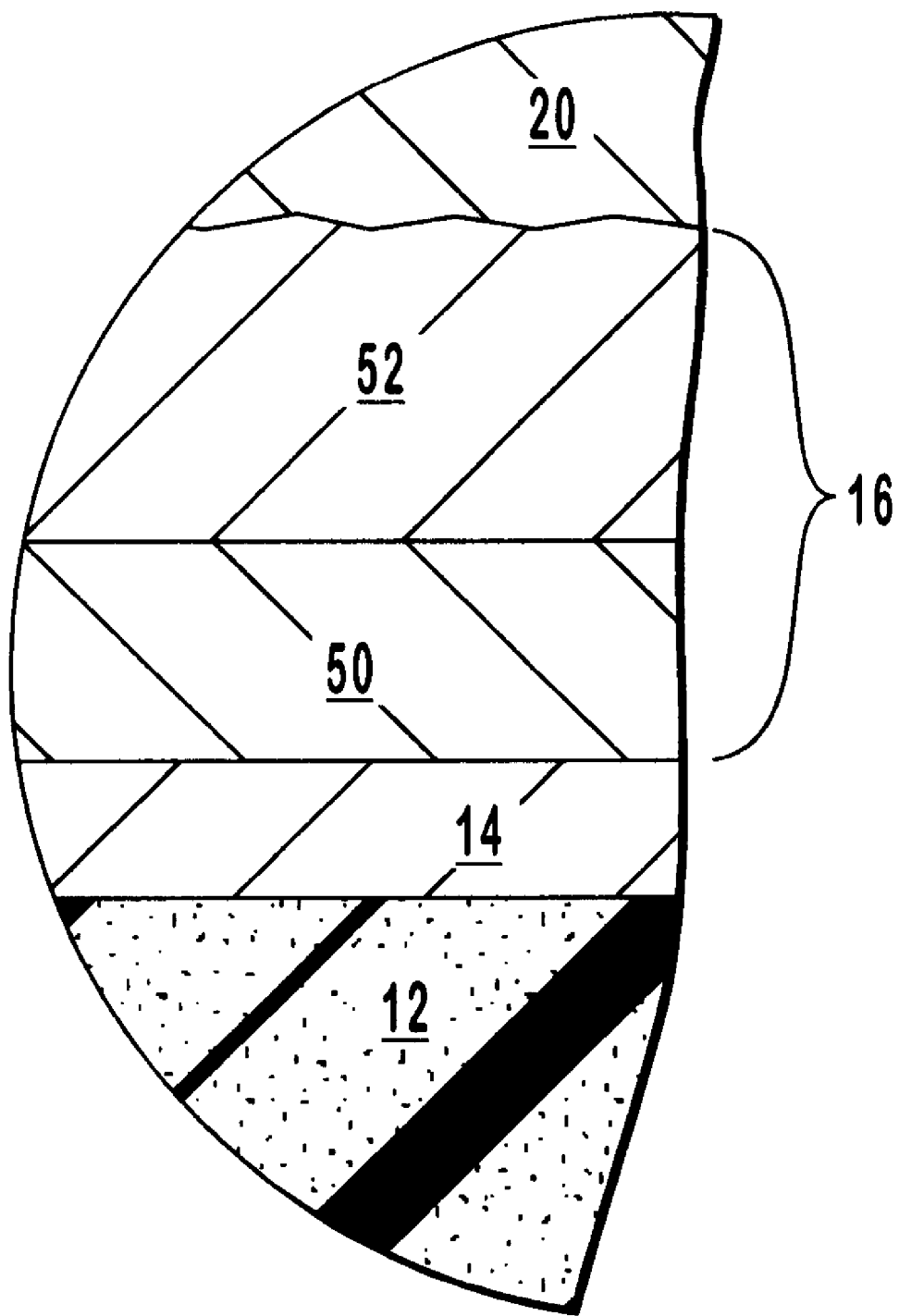
FIG. 11 illustrates a detail section taken along a section line 11—11 from FIG. 2, in which the first layer of polysilicon is depicted as two layers: a primary layer being substantially composed of a smooth polysilicon material, and a secondary layer being substantially composed of a rough or HSG polysilicon material.

FIG. 11 is a detail section taken along the line 11—11 in FIG. 2. Polysilicon layer 16 is illustrated as including a first polysilicon layer 50 and a second polysilicon layer 52. First polysilicon layer 50 is smooth polysilicon as defined above, and second polysilicon layer 52 is rough or HSG polysilicon as defined above. In all the foregoing embodiments, polysilicon layer 16 is presumed to include the structure and processing option of including first polysilicon layer 50 and second polysilicon layer 52 where a specific application uses first polysilicon layer 50 and second polysilicon layer 52 for a preferred embodiment.

The present invention may be embodied in other specific forms without departing from its spirit or essential characteristics. The described embodiments are to be considered in all respects only as illustrated and not restrictive. The scope of the invention is, therefore, indicated by the appended claims and their combination in whole or in part rather than by the foregoing description. All changes that come within the meaning and range of equivalency of the claims are to be embraced within their scope.

What is claimed and desired to be secured by United States Letters Patent is:

1. A method of forming a submicron surface on a structure comprising:
    forming a first layer on a semiconductor substrate, said first layer including at least one polysilicon layer, said at least one polysilicon layer having a thickness of less than about 500 Å and a grain size in a range from about 500 Å to about 2,500 Å;
    forming a second layer substantially composed of a nitride material, disposed substantially conformably upon said first layer, said second layer material having a thickness in a range from about 200 Å to about 1,000 Å; and
    forming and patterning a layer of photoresist upon said second layer to expose first and second points on said second layer.

2. The method as defined in claim 1, wherein said first and second points on said second layer are separated a width of less than about 0.25 microns and are adjacent to a mask structure that is at least one of:
    a portion of said photoresist layer upon said second layer that:
        projects from said second layer; and
        extends continuously between the first and second points on said second layer; and
    primary and secondary portions of said photoresist layer that project from said second layer, wherein the primary portion of the photoresist layer is adjacent to the first point on the second layer and the secondary portion of the photoresist layer is adjacent to the second point on the second layer, and wherein the second layer is substantially continuously uncovered by said photoresist layer between the first and second points so as to be substantially exposed.

3. The method as defined in claim 1, wherein said second layer comprises silicon nitride.

4. The method as defined in claim 1, wherein said second layer comprises $Si_xN$ where x is in a range from greater than 0.75 to 10.

5. The method as defined in claim 1, wherein a feature surface on said second layer extends between the first and second points, the method further comprising defining under said feature surface a patterned space having a width not greater than that of the feature surface, said patterned space being selected from the group consisting of a contact hole, a via, a wiring trench, an active area and an isolation trench.

6. The method as defined in claim 1, wherein said second layer includes a layer of polysilicon upon which said at least one mask structure is situated.

7. The method as defined in claim 1, wherein said second layer includes a layer of polysilicon, wherein a nitride material is formed above said layer of polysilicon, and wherein said layer of photoresist is situated upon said nitride material.

8. The method as defined in claim 1, wherein a feature surface on said second layer extends between the first and second points, the method further comprising:
    forming a recess under said feature surface in said first layer, said second layer, and said semiconductor substrate having a width less than or equal to that of said feature surface;
    filling said recess with a dielectric material;
    removing substantially all material above an upper level of said recess to form a substantially planar surface including substantially co-planar surfaces on said first layer and said dielectric material; and
    forming a primary layer upon said substantially planar surface substantially composed of material selected from the group consisting of polysilicon and a nitride material.

9. The method as defined in claim 8, further comprising:
    forming a secondary layer upon said primary layer, said secondary layer being selected from the group consisting of polysilicon and a nitride material.

10. The method as defined in claim 1, wherein forming the second layer is by a method selected from the group consisting of CVD and thermal transformation of polysilicon.

11. The method as defined in claim 1, wherein forming and patterning the layer of photoresist upon said second layer to expose first and second points on said second layer comprises exposing said photoresist layer to an incident patterning light, and wherein the first and second layer have a combined reflectivity to said incident patterning light of less than about 10% of incident patterning light.

12. The method as defined in to claim 1, wherein said at least one polysilicon layer is formed so as to have said grain size by a process selected from the group consisting of heat treatment of said at least one polysilicon layer, etching a surface upon said semiconductor substrate prior to formation of said at least one polysilicon layer, and flashing of entrapped undisassociated CVD feed material in a deposition of said at least one polysilicon layer.

13. A method of forming a submicron surface on a structure comprising:

forming a first layer on a semiconductor substrate, said first layer including at least one polysilicon layer, said at least one polysilicon layer having a thickness of less than about 500 Å and a grain size in a range from about 500 Å to about 2,500 Å;

forming a second layer substantially composed of a nitride material, disposed substantially conformably upon said first layer, said second layer having a thickness in a range from about 200 Å to about 1,000 Å; and forming and patterning a layer of photoresist upon said second layer to expose first and second points on said second layer, wherein said first and second points on said second layer are separated by a width of less than about 0.25 microns and are adjacent to a mask structure that is at least one of:

a portion of said photoresist layer upon said second layer that:
projects from said second layer; and
extends continuously between the first and second points on said second layer; and primary and secondary portions of said photoresist layer that project from said second layer, wherein the primary portion of the photoresist layer is adjacent to the first point on the second layer and the secondary portion of the photoresist layer is adjacent to the second point on the second layer, and wherein the second layer is substantially continuously uncovered by said photoresist layer between the first and second points so as to be substantially exposed.

14. The method as defined in claim 13, wherein said second layer comprises silicon nitride.

15. The method as defined in claim 13, wherein said second layer comprises $Si_xN$ where x is in a range from greater than 0.75 to 10.

16. The method as defined in claim 13, wherein said second layer includes a layer of polysilicon upon which said layer of photoresist is situated.

17. The method as defined in claim 13, wherein said second layer includes a layer of polysilicon, wherein a nitride material is formed above said layer of polysilicon, and wherein said layer of photoresist is situated upon said nitride material.

18. The method as defined in claim 13, wherein a feature surface on said second layer extends between the first and second points, the method further comprising:

forming a recess under said feature surface in said first layer, said second layer, and said semiconductor substrate having a width less than or equal to that of said feature surface;

filling said recess with a dielectric material;

removing substantially all material above an upper level of said recess to form a substantially planar surface including substantially co-planar surfaces on said first layer and said dielectric material; and forming a primary layer upon said substantially planar surface substantially composed of material selected from the group consisting of polysilicon and a nitride material.

19. The method as defined in claim 18, further comprising:

forming a secondary layer upon said primary layer, said secondary layer being selected from the group consisting of polysilicon and a nitride material.

20. A method of forming a submicron surface on a structure comprising:

forming a first layer on a semiconductor substrate, said first layer including at least one polysilicon layer, said at least one polysilicon layer having a thickness of less than about 500 Å and a grain size in a range from about 500 Å to about 2,500 Å and being formed:

so as to have said grain size by a process selected from the group consisting of heat treatment of said at least one polysilicon layer, etching a surface upon said semiconductor substrate prior to formation of said at least one polysilicon layer, and flashing of entrapped undisassociated CVD feed material in a deposition of said at least one polysilicon layer;

forming a second layer substantially composed of a nitride material, disposed substantially conformably upon said first layer, said second layer having a thickness in a range from about 200 Å to about 1,000 Å; and forming and patterning a layer of photoresist upon said second layer to expose first and second points on said second layer so as to expose said photoresist layer to an incident patterning light, and wherein the first and second layer have a combined reflectivity to said incident patterning light of less than about 10% of incident patterning light.

21. The method as defined in claim 20, wherein a feature surface on said second layer extends between the first and second points, the method further comprising:

forming a recess under said feature surface in said first layer, said second layer, and said semiconductor substrate having a width less than or equal to that of said feature surface;

filling said recess with a dielectric material;

removing substantially all material above an upper level of said recess to form a substantially planar surface including substantially co-planar surfaces on said first layer and said dielectric material; and forming a primary layer upon said substantially planar surface substantially composed of material selected from the group consisting of polysilicon and a nitride material.

22. The method as defined in claim 21, further comprising:

forming a secondary layer upon said primary layer, said secondary layer being selected from the group consisting of polysilicon and a nitride material.

23. The method as defined in claim 20, wherein forming the second layer is by a method selected from the group consisting of CVD and thermal transformation of polysilicon.

24. The method as defined in claim 20, wherein a feature surface on said second layer extends between the first and second points, the method further comprising defining under said feature surface a patterned space having a width not greater than that of the feature surface, said patterned space being selected from the group consisting of a contact hole, a via, a wiring trench, an active area and an isolation trench.

25. The method as defined in claim 20, wherein said second layer includes a layer of polysilicon upon which said at least one mask structure is situated.

26. The method as defined in claim 20, wherein said second layer includes a layer of polysilicon, wherein a nitride material is formed above said layer of polysilicon, and wherein said layer of photoresist is situated upon said layer of nitride material.

27. A method of forming a sub-micron surface on a structure comprising:

forming a first layer on a semiconductor substrate, said first layer including at least one polysilicon layer, said at least one polysilicon layer having a thickness of less than about 500 Å and a grain size in a range from about 500 Å to about 2,500 Å, wherein said at least one polysilicon layer is formed so as to have said grain size by a process selected from the group consisting of heat treatment of said at least one polysilicon layer, etching a surface upon said semiconductor substrate prior to formation of said at least one polysilicon layer, and flashing of entrapped undisassociated CVD feed material in a deposition of said at least one polysilicon layer;

forming a second layer disposed substantially conformably upon said first layer, said second layer having a thickness in a range from about 200 Å to about 1,000 Å; and forming and patterning a layer of photoresist upon said second layer to expose first and second points on said second layer, wherein a feature surface on said second layer extends to terminate at the first and second points, wherein said first and second points on said second layer are separated by a width of less than about 0.25 microns and are adjacent to a mask structure that is at least one of:

a portion of said photoresist layer upon said second layer that:

projects from said second layer; and extends continuously between the first and second points on said second layer; and primary and secondary portions of said photoresist layer that project from said second layer, wherein the primary portion of the photoresist layer is adjacent to the first point on the second layer and the secondary portion of the photoresist layer is adjacent to the second point on the second layer, and wherein the second layer is substantially continuously uncovered by said photoresist layer between the first and second points so as to be substantially exposed forming a recess under said feature surface in said first layer, within said second layer, and within said semiconductor substrate having a width less than or equal to that of said feature surface;

filling said recess with a dielectric material;

removing substantially all material above an upper level of said recess to form a substantially planar surface including substantially co-planar surfaces on said first layer and said dielectric material;

forming a primary layer upon said substantially planar surface substantially composed of material selected from the group consisting of polysilicon and a nitride material; and forming a nitride material upon said primary layer by a method selected from the group consisting of CVD and thermal transformation of polysilicon material.

28. A method of an antireflective structure comprising:

forming a first layer on a semiconductor substrate, said first layer including at least one polysilicon layer, said at least one polysilicon layer having a thickness of less than about 500 Å and a grain size in a range from about 500 Å to about 2,500 Å and being formed so as to have said grain size by a process selected from the group consisting of heat treatment of said at least one polysilicon layer, etching a surface upon said semiconductor substrate prior to formation of said at least one polysilicon layer, and flashing of entrapped undisassociated CVD feed material in a deposition of said at least one polysilicon layer;

forming a second layer disposed substantially conformably upon said first layer, said second layer:

having a thickness in a range from about 200 Å to about 1,000 Å, having a feature surface on said second layer extends between the first and second points, there being defined under said feature surface a patterned space having a width not greater than that of the feature surface, said patterned space being selected from the group consisting of a contact hole, a via, a wiring trench, an active area and an isolation trench; and being formed of a nitride material by a process selected from the group consisting of CVD and thermal transformation of polysilicon;

forming and patterning a layer of photoresist upon said second layer to expose first and second points on said second layer so as to expose said photoresist layer to an incident patterning light, and wherein the first and second layer have a combined reflectivity to said incident patterning light of less than about 10% of incident patterning light;

forming a recess under said feature surface in said first layer, said second layer, and said semiconductor substrate having a width less than or equal to that of said feature surface;

filling said recess with a dielectric material;

removing substantially all material above an upper level of said recess to form a substantially planar surface including substantially co-planar surfaces on said first layer and said dielectric material; and forming a primary layer upon said substantially planar surface substantially composed of material selected from the group consisting of polysilicon and a nitride material;

forming a secondary layer upon said primary layer, said secondary layer being selected from the group consisting of polysilicon and a nitride material.

\* \* \* \* \*

UNITED STATES PATENT AND TRADEMARK OFFICE
CERTIFICATE OF CORRECTION

PATENT NO. : 5,990,002

DATED : Nov. 23, 1999

INVENTOR(S) : Ardavan Niroomand; Fernando Gonzalez

It is certified that error appears in the above-identified patent and that said Letters Patent is hereby corrected as shown below:

Cover Page, Abstract, line 3, after "either" delete "that"

Cover Page, Abstract, line 15, after "upon" delete "on"

Col. 3, line 64, after "so as" delete "so"

Col. 4, line 28, change "comprises" to --comprise--

Col. 5, line 4, after "upon" delete "on"

Col. 5, line 48, after "alternating" change "layer" to --layers--

Col. 7, line 31, after "upon" delete "on"

Col. 8, line 41, after "do not" change "substantial" to --substantially--

Col. 9, line 10, after "defined" insert --by--

Col. 12, line 60, after "upon" delete "on"

Col. 14, line 21, after "36" change "is" to --has--

UNITED STATES PATENT AND TRADEMARK OFFICE
CERTIFICATE OF CORRECTION

PATENT NO. : 5,990,002
DATED : November 23, 1999
INVENTOR(S) : Ardavan Niroomand, Fernando Gonzalez It is certified that error appears in the above-indentified patent and that said Letters Patent is hereby corrected as shown below:

Col. 15, line 3, after "to a" change "lever" to --level--.

Signed and Sealed this

Twenty-seventh Day of March, 2001

Attest:

NICHOLAS P. GODICI

Attesting Officer

Acting Director of the United States Patent and Trademark Office